US012154967B2

(12) United States Patent
Iucolano et al.

(10) Patent No.: US 12,154,967 B2
(45) Date of Patent: Nov. 26, 2024

(54) METHOD FOR MANUFACTURING AN OHMIC CONTACT FOR A HEMT DEVICE

(71) Applicant: STMICROELECTRONICS S.R.L., Agrate Brianza (IT)

(72) Inventors: Ferdinando Iucolano, Gravina di Catania (IT); Cristina Tringali, Augusta (IT)

(73) Assignee: STMICROELECTRONICS S.r.l., Agrate Brianza (IT)

(*) Notice: Subject to any disclaimer, the term of this patent is extended or adjusted under 35 U.S.C. 154(b) by 0 days.

(21) Appl. No.: 16/697,051

(22) Filed: Nov. 26, 2019

(65) Prior Publication Data
US 2020/0168718 A1  May 28, 2020

(30) Foreign Application Priority Data
Nov. 28, 2018  (IT) .................. 102018000010656

(51) Int. Cl.
*H01L 29/66* (2006.01)
*H01L 29/20* (2006.01)
*H01L 29/778* (2006.01)

(52) U.S. Cl.
CPC .... *H01L 29/66462* (2013.01); *H01L 29/2003* (2013.01); *H01L 29/7786* (2013.01); *H01L 29/7787* (2013.01)

(58) Field of Classification Search
None
See application file for complete search history.

(56) References Cited

U.S. PATENT DOCUMENTS

| | | | |
|---|---|---|---|
| 9,761,438 B1* | 9/2017 | Chu | H01L 29/4236 |
| 2004/0094759 A1 | 5/2004 | Nguyen et al. | |
| 2010/0244104 A1* | 9/2010 | Makiyama | H01L 29/7787 |
| | | | 257/E21.445 |
| 2012/0205663 A1 | 8/2012 | Nakamura et al. | |
| 2017/0194195 A1 | 7/2017 | Cohen et al. | |

FOREIGN PATENT DOCUMENTS

TW  200949953 A  12/2009

OTHER PUBLICATIONS

Lin, Y-K "A versatile low-resistance ohmic contact process with ohmic recess and low-temperature annealing for GaN HEMTs" Semicond. Sci Technol. 33 Aug. 21, 2018 pp. 1-8 (Year: 2018).*
Selvanathan, D. "Comparative study of Ti/Al/Mo/Au, Mo/Al/Mo/Au, and V/Al/Mo/Au ohmic contacts to AlGaN/GaN heterostructures" J. Vac. Sci. Technol. B 22(5) Nov. 2004 pp. 2409-2416 (Year: 2004).*

(Continued)

*Primary Examiner* — Grant S Withers
(74) *Attorney, Agent, or Firm* — Seed IP Law Group LLP

(57) ABSTRACT

A method for manufacturing an ohmic contact for a HEMT device, comprising the steps of: forming a photoresist layer, on a semiconductor body comprising a heterostructure; forming, in the photoresist layer, an opening, through which a surface region of the semiconductor body is exposed at said heterostructure; etching the surface region of the semiconductor body using the photoresist layer as etching mask to form a trench in the heterostructure; depositing one or more metal layers in said trench and on the photoresist layer; and carrying out a process of lift-off of the photoresist layer.

18 Claims, 8 Drawing Sheets

(56) References Cited

OTHER PUBLICATIONS

Taking, S. "AlN/GaN MOS-HEMTs Technology PHD Thesis" archived at Wayback Machine Archive as of Feb. 11, 2018 at https://web.archive.org/web/20181102085800/http://theses.gla.ac.uk/3356/1/2012takingphd.pdf (Year: 2018).*

Duffy, S. J. "Low Source/Drain Contact Resistance for AlGaN/GaN HEMTs with High Al Concentration and Si-HP [111] substrate" ECS Jour. Of Sol. State Sci. and Tech. 6 (11) Sep. 7, 2017 (Year: 2017).*

Kuliev, A. "0.15 um gate-length AlGaN/GaN HEMTs with varying gate recess length" Solid-State Elec. 47 Jan. 2003 pp. 117-122 (Year: 2003).*

Zhang, J. "Ultralow-Contact-Resistance Au-Free Ohmic Contacts With Low Annealing Temperature on AlGaN/GaN Heterostructures" IEEE Elec. Dev. Lett. vol. 39, No. 6, Jun. 2018 pp. 847-850 (Year: 2018).*

El-Zammar et al., "A simple non-recessed and Au-free high quality Ohmic contacts on AlGaN/ GaN: The case of Ti/Al alloy," *Materials Science in Semiconductor Processing* 78:107-110, 2018.

Firrincieli et al., "Au-Free Low Temperature Ohmic Contacts for AlGaN/GaN Power Devices on 200 mm Si Substrates," International Conference on Solid State Devices and Materials, Sep. 24-27, 2013, Fukuoka, Japan, pp. 914-915.

Greco et al., "Ohmic contacts to Gallium Nitride materials," *Applied Surface Science* 383:324-345, 2016.

Iucolano et al., "Correlation between microstructure and temperature dependent electrical behavior of annealed Ti/Al/Ni/Au Ohmic contacts to AlGaN/GaN heterostructures," *Applied Physics Letters* 103(20): 2013, 4 pages.

Liu et al., "Temperature dependence of Ohmic contact characteristics in AlGaN/GaN high electron mobility transistors from −50 to 200° C," *Applied Physics Letters* 94: 2009, 4 pages.

Malmros et al., "Electrical properties, microstructure, and thermal stability of Ta-based ohmic contacts annealed at low temperature for GaN HEMTs," *Semiconductor Science and Technology* 26: 2011, 8 pages.

Seo et al., "600 V-18 A GaN Power MOS-HEMTs on 150 mm Si Substrates With Au-Free Electrodes," *IEEE Electron Device Letters* 35(4):446-448, 2014.

Tham et al., "$Al_xGa_{1-x}N$/GaN MISHEMTs With a Common Gold-Free Metal-Stack for Source/Drain/Gate," *IEEE Electron Device Letters* 36(12):1291-1294, 2015.

Van Hove et al., "CMOS Process-Compatible High-Power Low-Leakage AlGaN/GaN MISHEMT on Silicon," *IEEE Electron Device Letters* 33(5):667-669, 2012 (4 pages).

Yao et al., "An Au-free GaN High Electron Mobility Transistor with Ti/Al/W Ohmic Metal Structure," IEEE 22nd International Symposium on the Physical and Failure Analysis of Integrated Circuits, Jun. 29-Jul. 2, 2015 Hsinchu, Taiwan, pp. 419-422.

Liu, et al., "Bimetallic structure fabricated by laser interference lithography for tuning 1 surface plasmon resonance," *Optics Express* 16(14), Jul. 2008. (9 pages).

* cited by examiner

METHOD FOR MANUFACTURING AN OHMIC CONTACT FOR A HEMT DEVICE

BACKGROUND

Technical Field

The present disclosure relates to a method for manufacturing an ohmic contact for a field-effect transistor with high electron mobility, known as HEMT (High Electron Mobility Transistor). In particular, the present disclosure discusses a procedure for self-alignment of a gold-free ohmic contact, which can be applied, for example, to source contacts and drain contacts of the HEMT device.

Description of the Related Art

As is known, a HEMT device comprises a heterostructure that has an interface between two different semiconductor materials, such as aluminum gallium nitride (AlGaN) and gallium nitride (GaN). When the HEMT device is appropriately biased, a layer of two-dimensional electron gas (2DEG) is induced at said interface.

The 2DEG layer represents an electron cloud with high charge density in which the charges possess high mobility. Such properties render the HEMT device attractive for radiofrequency (RF) applications and in power electronics.

Generally, the HEMT device comprises ohmic contacts for the source and drain terminals that are made of gold so as to enable low contact and access resistances to be achieved (c.f. Ferdinando Iucolano, Giuseppe Greco, and Fabrizio Roccaforte-Applied Physics Letters 103, 201604 (2013); doi: 10.1063/1.4828839).

The method for manufacturing gold ohmic contacts typically includes deposition of a sequence of metal layers on a semiconductor body formed by a stack including a substrate, a GaN layer and an AlGaN layer. The GaN and AlGaN layers form the heterostructure.

The above sequence of metal layers is obtained with known processes (such as lithographic and lift-off steps) and comprises a titanium (Ti) layer in contact with the surface of the semiconductor body, an aluminum (Al) layer on the titanium layer, a nickel (Ni) layer on the aluminum layer, and a deposition of gold (Au) on the nickel layer. The first three layers referred to above are adapted, in a known way, to promote adhesion of the gold (which functions as central body of the ohmic contact) to the semiconductor body.

The method for manufacturing gold ohmic contacts requires a thermal annealing process at high temperatures (for example, higher than 800° C.). In these temperature conditions, Ti reacts with the $N_2$ available in the GaN, to form titanium nitride. Charge transport is thus guided by a metal-like behavior of TiN due to intrusions of the metal in the 2DEG region. Formation of a gold contact is not in any case easy to implement on a CMOS line on account of the metallic contamination generated by gold, which would require dedicated equipment and segregated production areas.

A commonly used alternative approach is to resort to gold-free ohmic contacts, where the central body of the ohmic contact is made of titanium and aluminum.

The absence of gold in the ohmic contacts enables reduction of the annealing temperature to 600° C. and use of techniques such as rapid thermal annealing (RTA). In particular, the RTA technique reduces the mechanical stresses to which the semiconductor body with ohmic contact is subjected and prevents formation of states of charge trap, thus improving the efficiency and productivity of the manufacturing process and of the HEMT device itself.

Various ohmic-contact physical structures of the gold-free type are known in the prior art. In particular, two of them are illustrated, in a side section view, in FIGS. 1A and 1B.

FIG. 1A shows an ohmic-contact structure 4 in a HEMT device of a known type, with non-recessed semiconductor body 2 (Jing-Neng Yao, et al., "An Au-free GaN High Electron Mobility Transistor with Ti/Al/W Ohmic Metal Structure", IEEE, 2015). A passivation layer 3, for example of SiN, extends over the semiconductor body 2 and in particular on the ohmic contact 4, to protect the latter.

FIG. 1B shows an ohmic-contact structure 6 in a HEMT device of a known type, with recessed semiconductor body 7 (W. H. Tham, et al., "AlxGa1 xN/GaN MISHEMTs with a common gold-free metal-stack for source/drain/gate", IEEE ELECTRON DEVICE LETTERS, VOL. 36, No. 12, December 2015). A dielectric layer 8, for example of SiN, extends over the semiconductor body 7. The ohmic contact 6 extends through the dielectric layer 8.

The process for manufacturing the ohmic contact 6, recessed in the semiconductor body 7 (FIG. 1B) proves to be more complex than the process for obtaining the non-recessed ohmic-contact structure 4 (FIG. 1A). However, the electrical performance achieved by the HEMT device of the type illustrated in FIG. 1B proves to be higher than the electrical performance achieved by the HEMT device of FIG. 1A, and moreover presents better reproducibility and reliability.

In addition, the use of passivating material (here, SiN) for protecting the ohmic contacts 4 and 6 causes a greater dispersion of the values of contact resistance thereof.

BRIEF SUMMARY

The aim of the present disclosure is to provide a method for manufacturing an ohmic contact for a HEMT device that will overcome the limitations of the prior art.

According to the present disclosure a method for manufacturing an ohmic contact for a HEMT device is provided.

BRIEF DESCRIPTION OF THE SEVERAL VIEWS OF THE DRAWINGS

For a better understanding of the present disclosure, a preferred embodiment is now described purely by way of non-limiting example, with reference to the attached drawings, wherein.

DETAILED DESCRIPTION

Figure 1A:
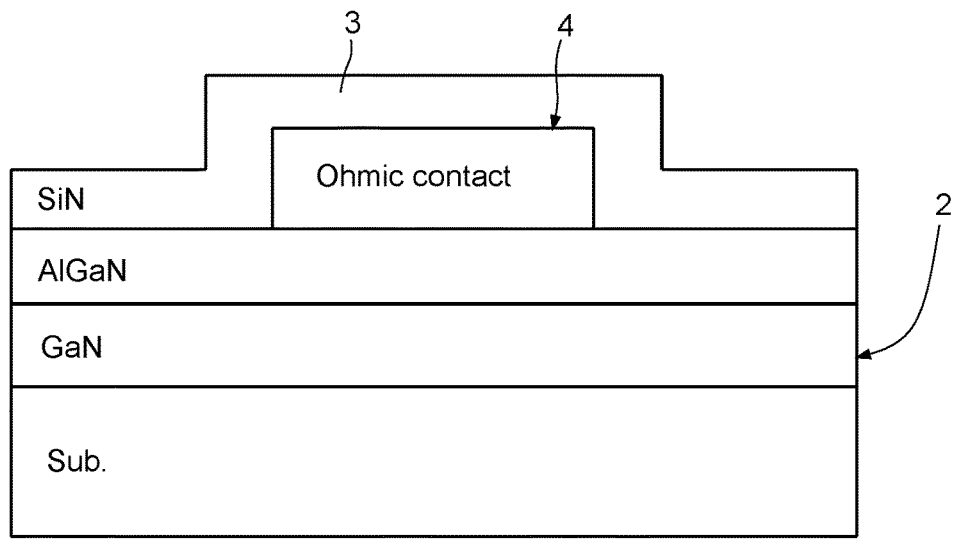
FIGS. 1A and 1B show, in side section views of a respective HEMT device with non-recessed ohmic contacts and with ohmic contacts recessed in a semiconductor body, respectively, according to embodiments of a known type.
Figure 1B:
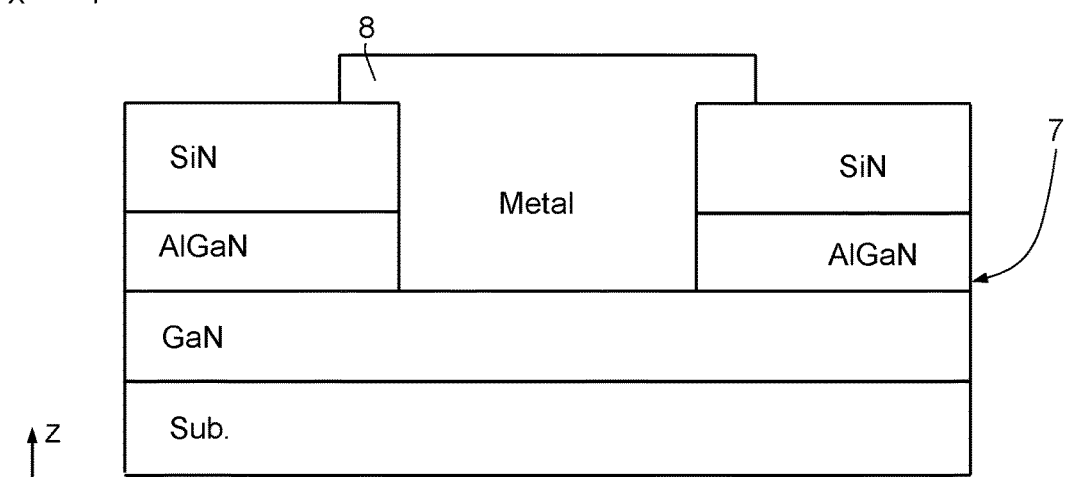
Figure 2:
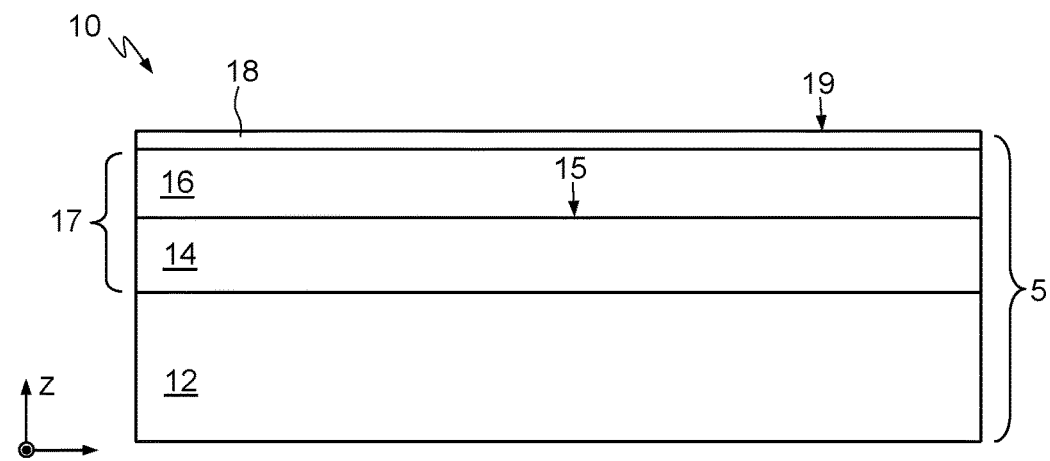
FIGS. 2-6 show, in a side section view, manufacturing steps for obtaining a HEMT device with ohmic contact recessed in a semiconductor body, according to an embodiment of the present disclosure.
Figure 4:
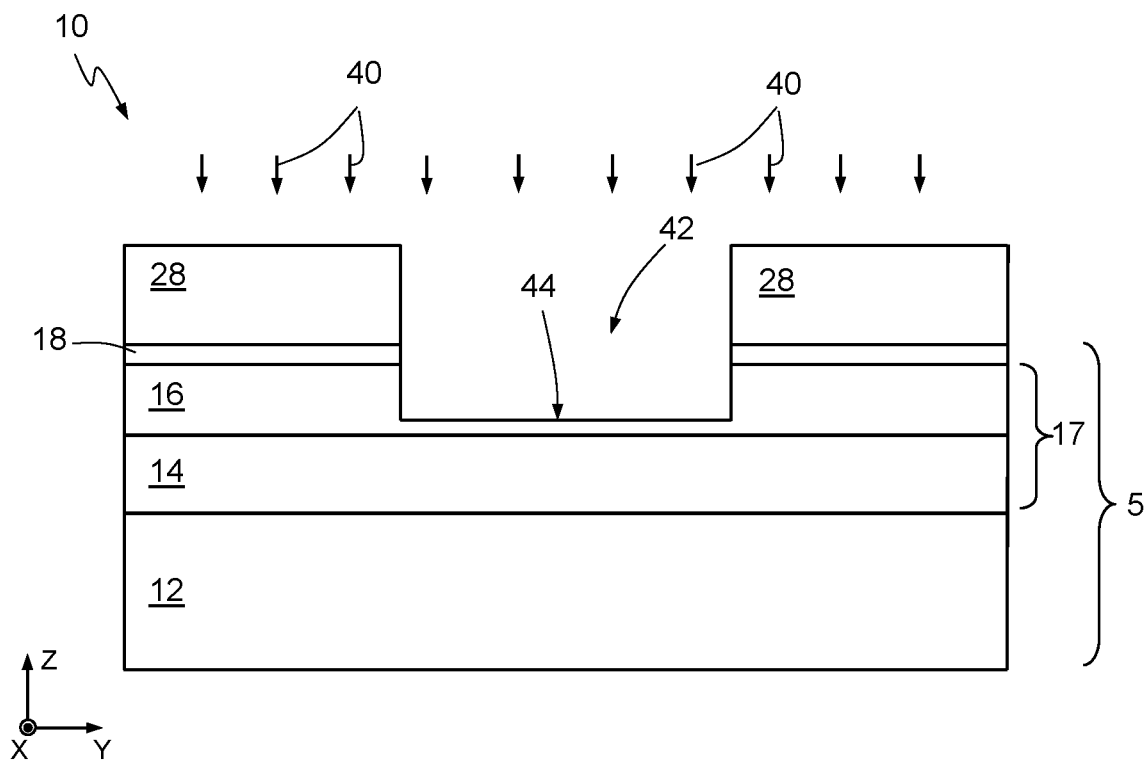
Figure 5:
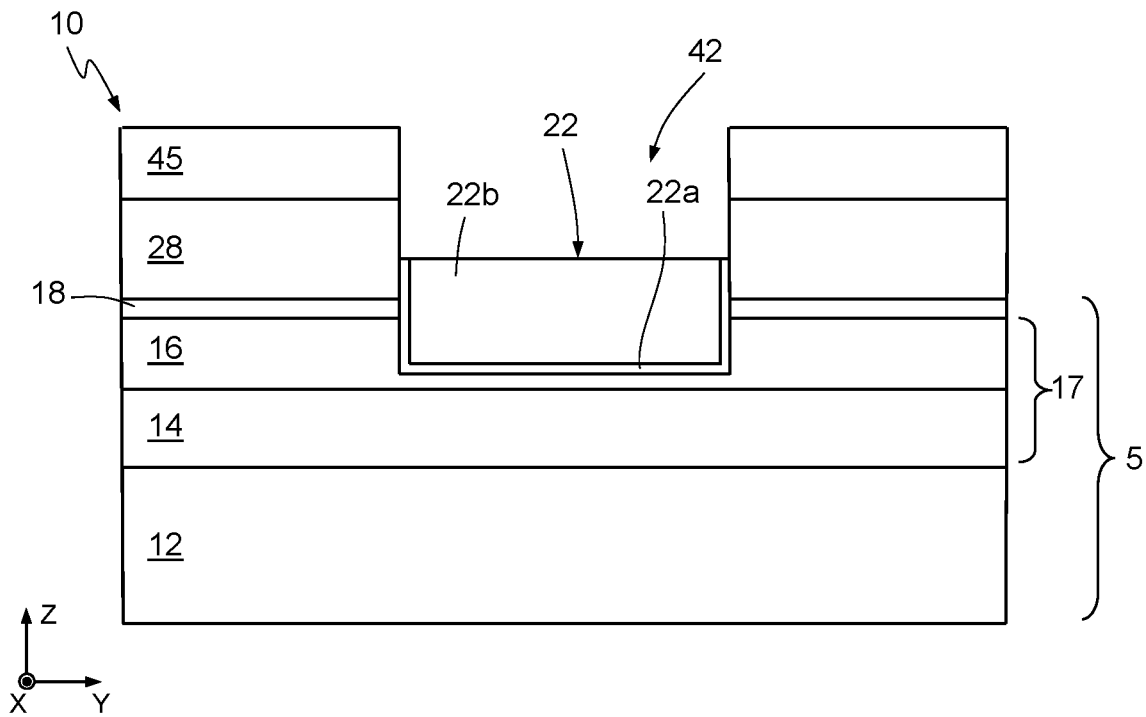
Figure 6:
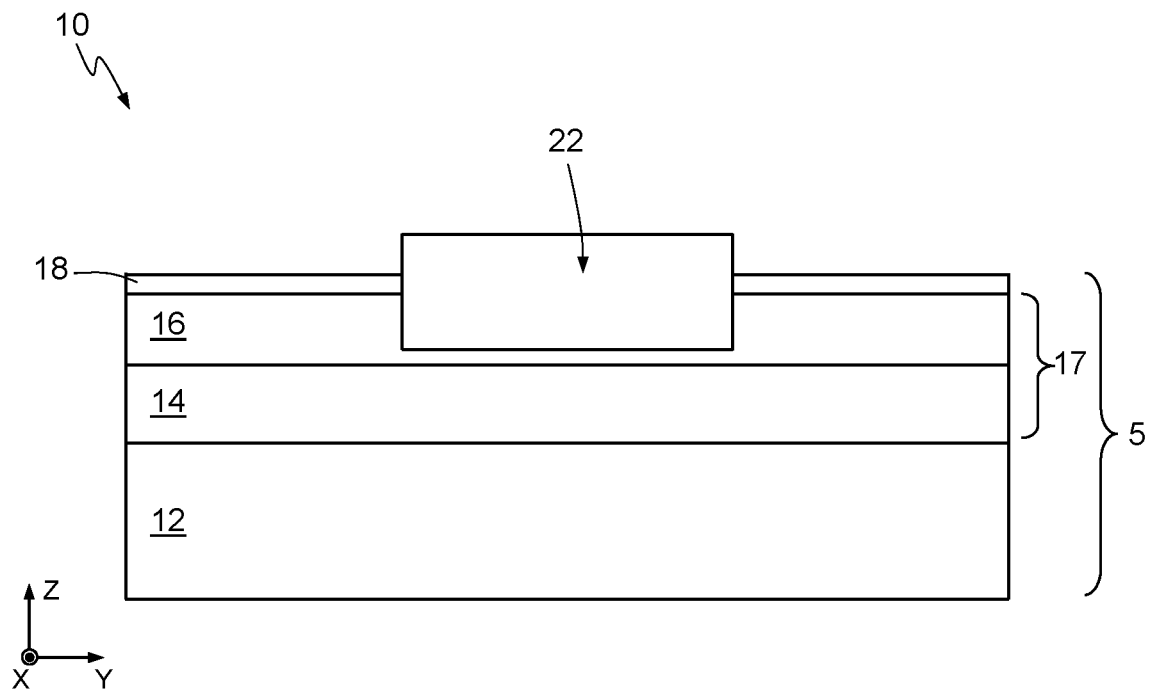

FIGS. 2-6 illustrate, in a side section view, in a triaxial cartesian reference system X, Y, Z, manufacturing steps for obtaining an ohmic-contact structure 10, of a recessed type, illustrated, as a whole, in FIG. 6. The structure 10 forms part of a HEMT device. With reference to FIG. 2, a substrate 12 of semiconductor material, such as silicon, or silicon carbide (SiC), or sapphire ($Al_2O_3$), or some other material, is provided. Formed on the substrate 12, in succession and in a way in itself known, along the direction of the axis Z are, respectively: a first structural layer 14, in particular of intrinsic gallium nitride (GaN) (channel layer of the HEMT device), grown, for example epitaxially, on the substrate 12; a second structural layer 16, in particular of intrinsic aluminum gallium nitride (AlGaN) or, more in general, of compounds based upon ternary or quaternary alloys of gallium nitride, such as AlxGa1-xN, AlInGaN, InxGa1-xN, AlxInl-xAl (barrier layer of the HEMT device), grown, for example epitaxially, on the channel layer 14; and optionally a protection layer 18, in particular of GaN with a thickness of just a few nanometers (e.g., 1-4 nm), having the function of protecting the barrier layer 16 from oxidation phenomena.

The channel layer 14 and the barrier layer 16 form, in a way in itself known, a heterostructure 17.

In a way not illustrated in the Figure, between the substrate 12 and the channel layer 14 one or more further buffer layers may be present.

The channel layer 14 has a thickness (along the axis Z), for example approximately between 1 μm and 5 μm; the barrier layer 16 has a thickness (along the axis Z), for example approximately between 5 nm and 30 nm.

A 2DEG layer 15 is formed at the interface between the channel layer 14 and the barrier layer 16. The charge carriers belonging to the 2DEG are free to move in any direction in a plane XY (defined by the axes X and Y) at the 2DEG interface 15, whereas they are confined along the axis Z.

The substrate 12, the channel layer 14, the barrier layer 16, and the protection layer 18 form a semiconductor body 5.

Figure 3A:
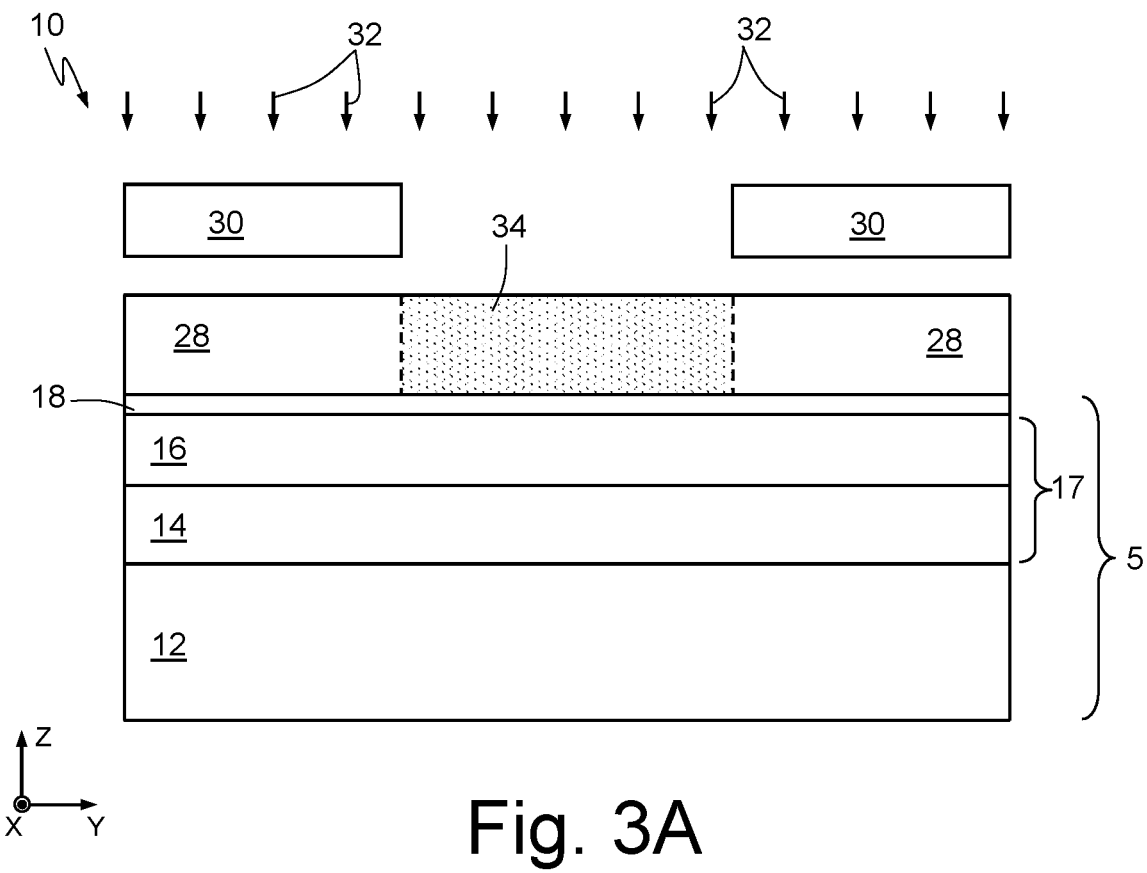
Figure 3B:
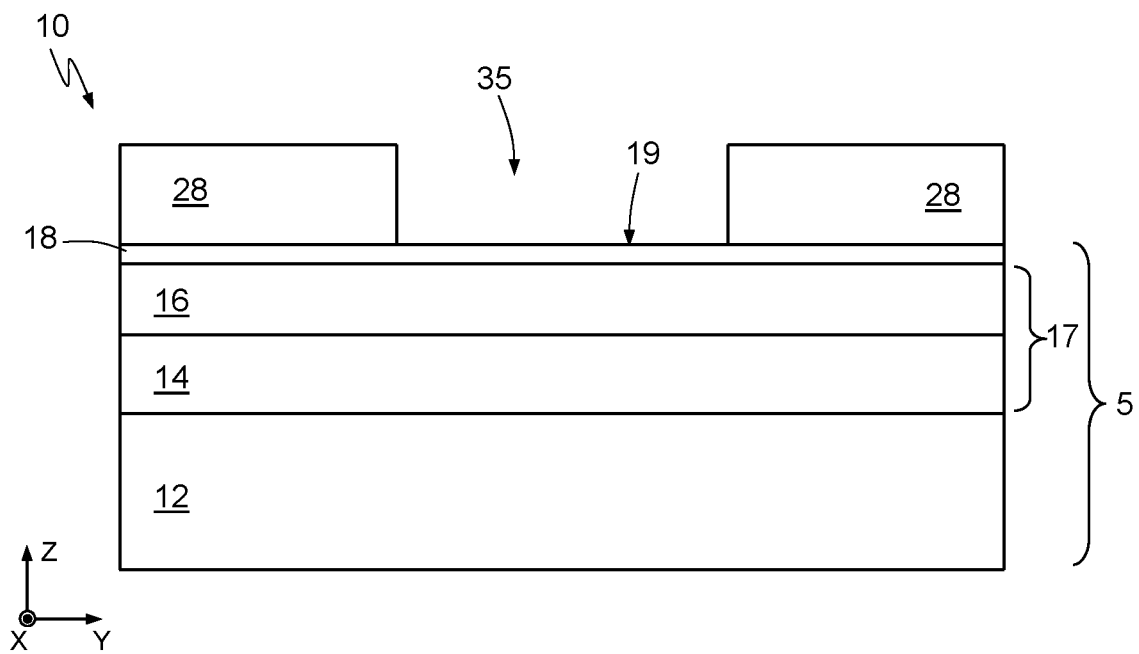

With reference to FIG. 3A, a photoresist layer 28, with a thickness, for example, of between 1 and 3 μm is deposited. Said photoresist layer 28 entirely and evenly coats the epitaxial layer 18.

This is then followed by a step of photolithographic exposure (represented by the arrows 32) of the photoresist layer 28, via the use of a mask 30. The regions of the photoresist layer 28 not covered by the mask 30 thus become soluble during the subsequent etching step.

The mask 30 is such that a region 34 of the photoresist layer 28 is exposed. Said region 34 defines the region in which the ohmic contact will be provided.

Then (FIG. 3B), the mask 30 is removed, and an etching step (e.g., of a wet type) is carried out for selective removal of the region 34 of the photoresist layer 28. A trench 35 is thus formed in the photoresist layer 28, through which a surface portion 19 of the protection layer 18 is exposed.

The photolithographic steps listed above have been described with reference to a positive photoresist. A different embodiment, not illustrated, envisages the use of a negative photoresist to form the trench 35 in the photoresist layer 28 with appropriate modifications to the photolithographic mask used, in a way in itself evident to the person skilled in the art.

It may be noted that the process described with reference to FIGS. 1-3B does not require deposition of a layer of passivating material (such as silicon nitride), as typically envisaged by the prior art.

With reference to FIG. 4, an etch is then carried out (represented by arrows 40) for selective removal of portions of the protection layer 18 and of the underlying barrier layer 16, which are exposed through the trench 35. More in particular, the etching process comprises a first step, for removing the protection layer 18, and a second step, for partly or completely removing the barrier layer 16. Both of these steps use a $Cl_2$-based chemistry.

The photoresist layer 28 functions as an etching mask, for protecting the regions of the semiconductor body 5 not exposed through the trench 35.

At the trench 35, the semiconductor body 5 is then etched further, to form a contact trench 42, which extends in depth in the barrier layer 16, terminating inside the barrier layer 16 itself. The contact trench 42 is delimited underneath by a bottom surface 44 of the barrier layer 16.

The contact trench 42 is adapted to house an ohmic contact, as described hereinafter.

With reference to the etching process 40, the first etching step is designed to remove the protection layer 18 throughout its entire thickness in the area exposed by the trench 35, whereas the second etching step is designed to remove only part of the thickness, along Z, of the barrier layer 16. It is evident that, in the absence of the protection layer 18, which is optional, the etching process 40 comprises a single etching step for removing selective portions of the barrier layer 16.

Figure 13:
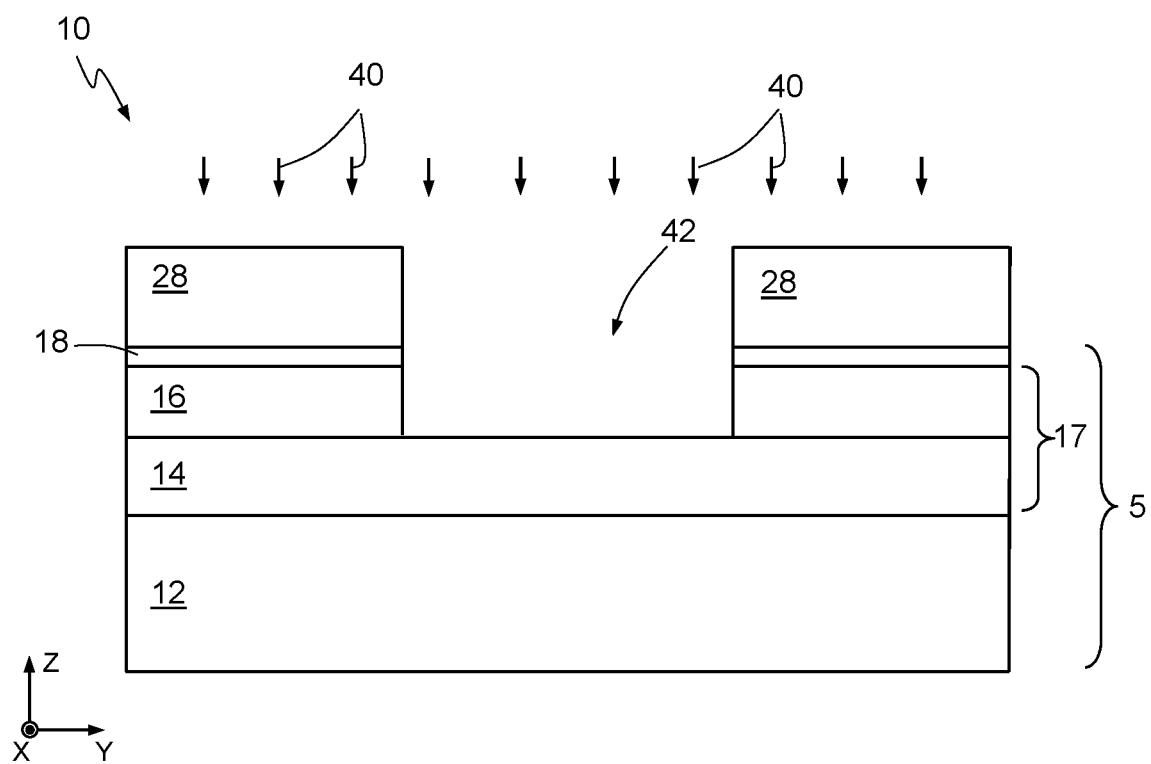
FIG. 13 is a side section view showing an HEMT device, according to one embodiment.

It is moreover evident that, in other embodiments, the contact trench 42 may extend throughout the entire thickness of the barrier layer 16, terminating at the interface with the underlying layer (here, the channel layer 14), or else proceeding into the underlying layer, according to the design needs and parameters. The embodiment of termination of the contact trench 42 at the interface with the channel layer 14 is shown in FIG. 13.

With reference to FIG. 5, there then follows deposition of one or more layers of conductive material, in particular one or more metal layers, via known techniques, such as sputtering or evaporation. In particular, a stack of metal layers is formed (three of which are illustrated in FIGS. 5 and 6) adapted to form an ohmic contact 22.

Formation of the stack of metal layers comprises, according to one embodiment, forming a first interface layer 22a and a filling layer 22b on the interface layer 22a. The interface layer 22a is made of a material chosen from titanium or tantalum. The filling layer 22b is, in particular, made of aluminum.

Formation of the stack of metal layers comprises, according to a further embodiment, forming in succession a first titanium or tantalum layer, an aluminum layer, and a second layer, which is also made of titanium or tantalum. The Ti layer is adapted to promote the adhesion of the nickel or tungsten layer to the bottom surface 44 of the contact trench 42 (i.e., to the barrier layer 16) and has the function of interface layer 22a. The Al layer functions, instead, as filling layer 22b, or central body, of the ohmic contact 22. The last Ti or Ta layer serves as packaging layer.

It is evident that other materials, or a different number of layers, may be used to form the stack of the ohmic contact 22, according to the design specifications. For instance, it is possible to omit the interface layer 22a by depositing just the filling layer 22b, which, in this case, is made of aluminum.

The one or more conductive materials for formation of the ohmic contact 22 are both deposited inside the trench 42 and on the outside thereof, over the photoresist layer 28, which is thus covered at the top by a spurious metal deposition 45.

This is followed by a lift-off step, for removing both the photoresist layer 28 and the spurious metal material 45.

A step of rapid thermal annealing (RTA) is then carried out, which enables perfecting of the ohmic contact, in a way in itself known. This procedure is conducted at a temperature ranging between approximately 450° C. and approximately 650° C., in protected environment (for example, in a nitrogen or argon atmosphere).

FIG. 6 shows the structure 10 at the end of the manufacturing steps described, which includes the recessed gold-free ohmic contact 22.

As may be seen, the ohmic contact 22 is automatically aligned, or self-aligned, to the recessed region formed previously in the heterostructure 17.

This result is achieved by using the same photoresist layer 28 in two different steps of the manufacturing process. Firstly, the photoresist layer 28 is used during etching 40 as a mask for creation of the contact trench 42 (and hence for defining the recessed region in the heterostructure 17). Moreover, the photoresist layer 28 is used as a further mask for forming the ohmic contact 22, by deposition of metal material.

Figure 7:
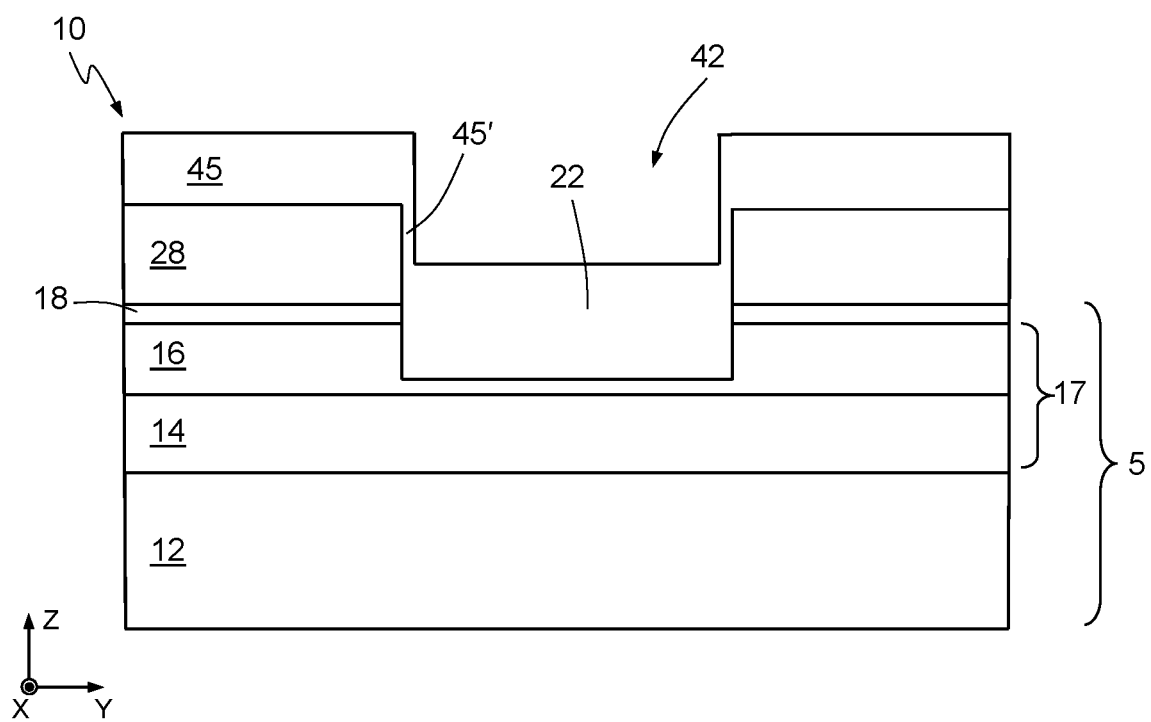
FIGS. 7-8 show intermediate structures that could be obtained according to the manufacturing steps of FIGS. 2-5.

FIG. 7 shows a possible arrangement following the deposition of the one or more metal layers to create the ohmic contact 22 and the spurious metal material 45. The arrangement of FIG. 7 is similar to the arrangement of FIG. 5 except for the addition of spurious metal material 45', sometimes referred to as "dog ears," along the sidewalls of the photoresist layer 28. Such spurious metal material 45' is a possible artifact of the metal deposition, such as sputtering or evaporation, of the one or more metal layers of the ohmic contact 22. Such spurious metal material 45' is undesirable because its connection to both the spurious metal material 45 and the ohmic contact 22 would prevent lift-off of the spurious metal material 45 and/or damage the ohmic contact 22.

Figure 8:
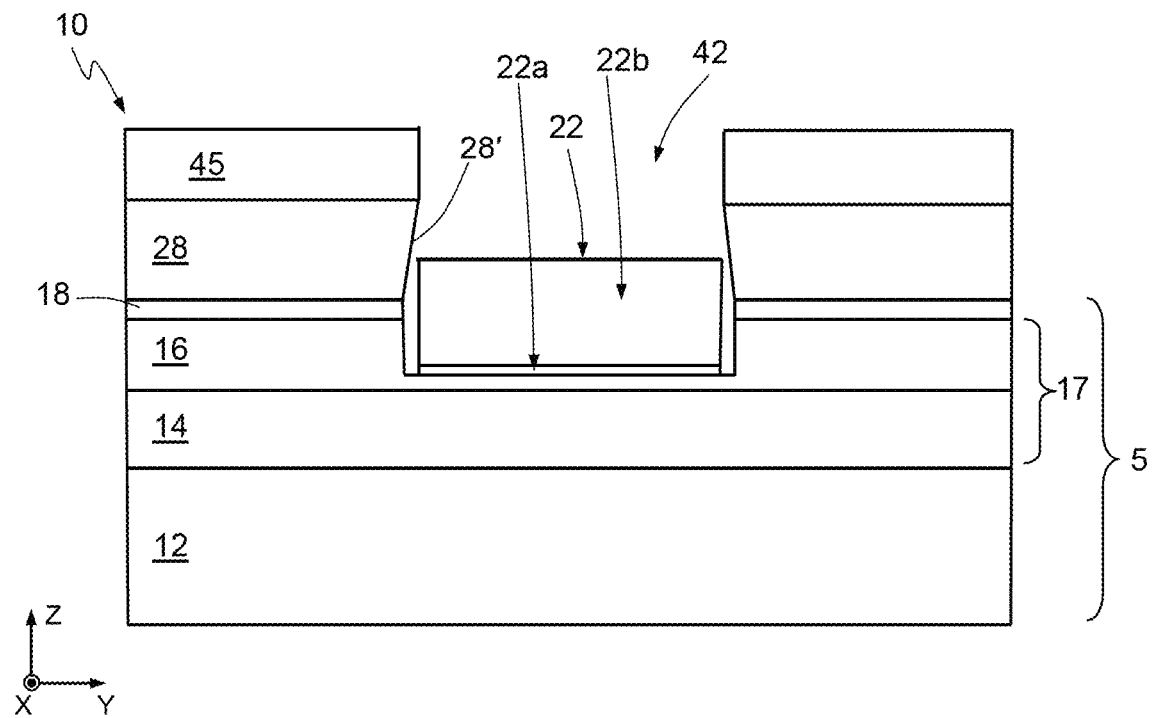

To avoid formation of the spurious metal material 45' along the sidewalls of the photoresist layer 28, one could form the photoresist layer with inclined sidewalls 28' as shown in FIG. 8. The deposition, such as by evaporation, of the one more layers to form the ohmic contact 22 is typically performed substantially vertically. As a result, the overhang of the inclined sidewalls 28' would enable the ohmic contact 22 to be formed in the contact trench 42 without contacting the inclined sidewalls 28' or the sidewalls of the layers 16, 18, and thus, without forming the spurious metal material 45' along the sidewalls of any of the layers 16, 18, 28. As a result, the lift-off of the spurious metal material 45 and photoresist layer 28 may proceed without damage to the ohmic contact 22. The ohmic contact 22 includes the thinner first interface layer 22a and the thicker filling layer 22b.

A problem with the arrangement shown in FIG. 8 is that control of the process for forming the inclined sidewalls 28' is difficult and would need to be very precise.

FIGS. 9A-12 illustrate manufacturing steps for obtaining an ohmic-contact structure 50 according to another embodiment of the disclosure.

Figure 9A:
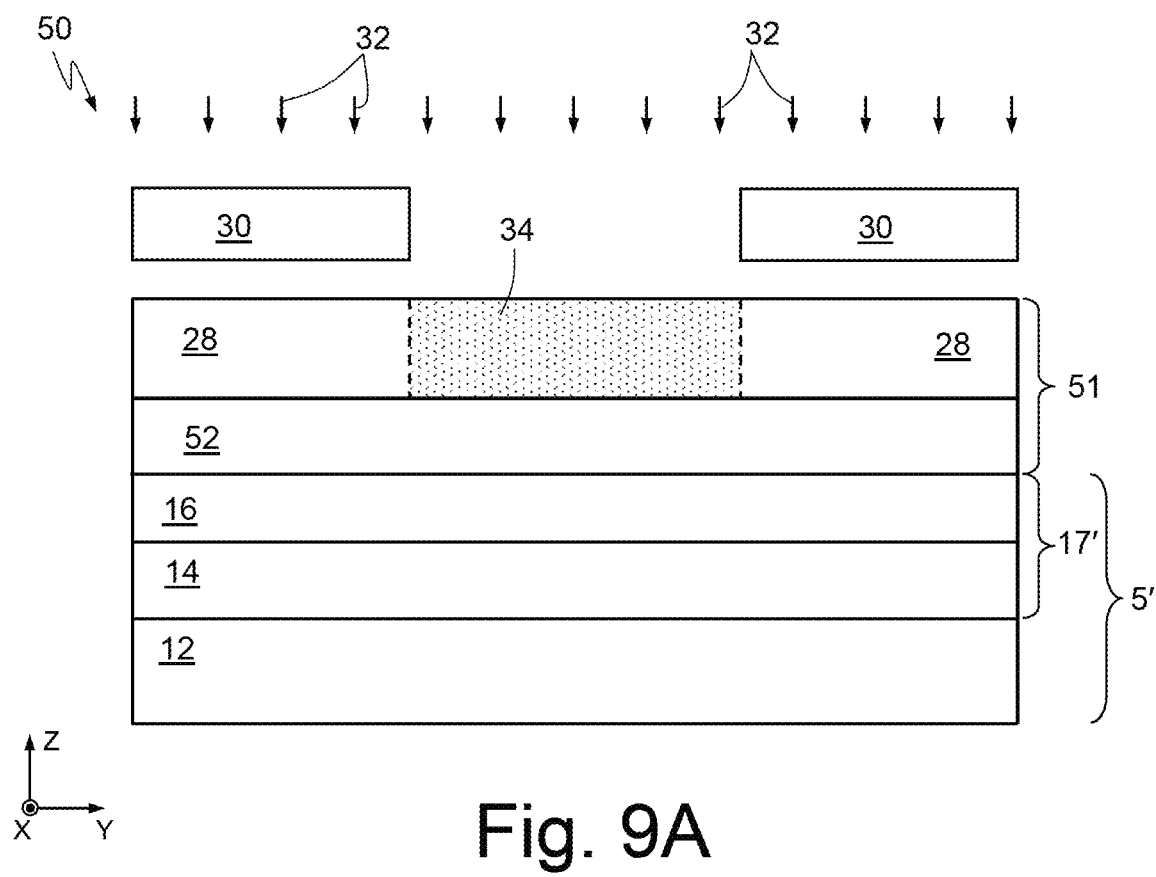
FIGS. 9A-12 show, in a side section view, manufacturing steps for obtaining a HEMT device with ohmic contact recessed in a semiconductor body, according to another embodiment of the present disclosure.

With reference to FIG. 9A, the structure 50 includes a semiconductor body 5' formed by the semiconductor substrate 12 and a heterostructure 17'. The heterostructure 17' is formed by the channel layer 14 and the barrier layer 16. As in the embodiment of FIGS. 2-6, the semiconductor body 5' could optionally include a protection layer, like the protection layer 18, for protecting the barrier layer.

Deposited on the semiconductor body 5' is a bilayer 51 that includes an underlayer 52 and the photoresist layer 28. The underlayer 52 may have a thickness slightly higher than the thickness of the evaporated metal, for example, of between 0.6 and 1.5 µm. The underlayer 52 may be a solution of organic polymer, such as SF11 or SF09, that is spun on the semiconductor body 5', or may be any other material that is etchable by the developer that is used to etch the photoresist layer 28.

The deposition of the bilayer 51 is followed by the step of photolithographic exposure (represented by the arrows 32) of the photoresist layer 28, via the use of the mask 30. The regions 34 of the photoresist layer 28 not covered by the mask 30 thus become soluble during the subsequent etching step.

Figure 9B:
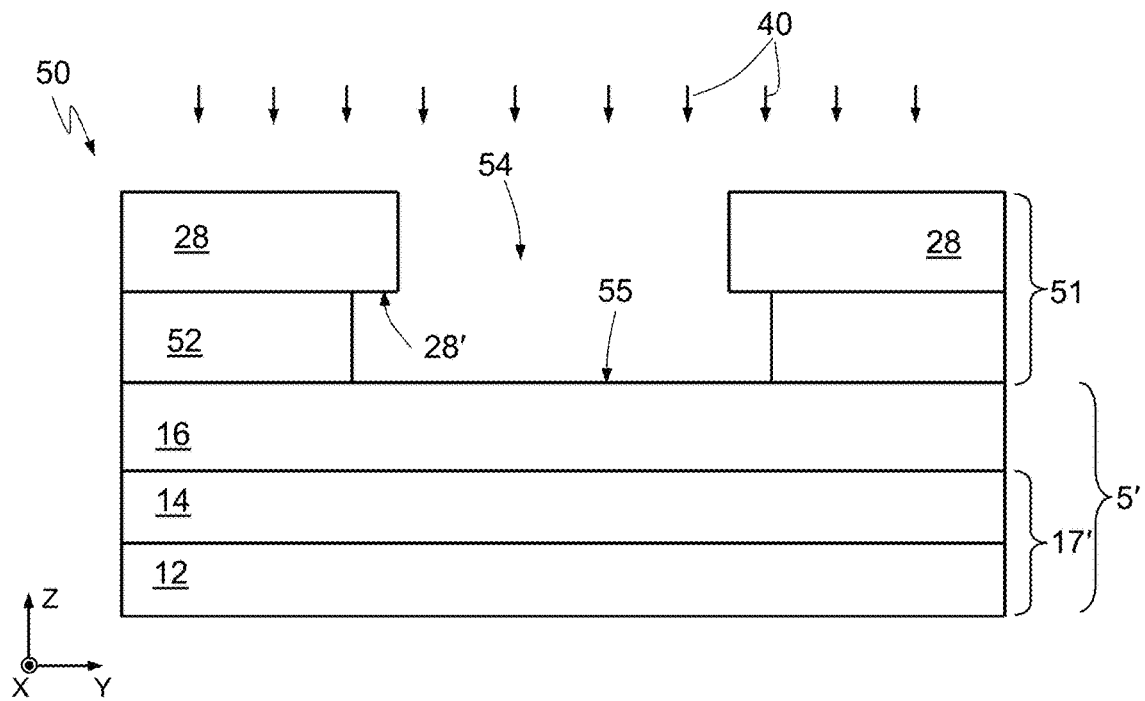

In FIG. 9B the mask 30 is removed, and an etching step (e.g., of a wet type) is carried out for selective removal of the region 34 of the photoresist layer 28 and a portion of the underlayer 52. A trench 54 is thus formed through the photoresist layer 28 and the underlayer 52, through which a surface portion 55 of the semiconductor body 5' is exposed. Forming the underlayer 52 of a material that is etchable by the developer that is used to remove the region 34 of the photoresist layer 28 and using a wet developer enables a portion 28' of the photoresist layer 28 to overhang a remaining portion of the underlayer 52.

The photolithographic steps listed above have been described with reference to a positive photoresist. A different embodiment, not illustrated, envisages the use of a negative photoresist to form the trench 54 with appropriate modifications to the photolithographic mask used, in a way in itself evident to the person skilled in the art.

It may be noted that the process described with reference to FIGS. 9A-9B does not require deposition of a layer of passivating material (such as silicon nitride), as typically envisaged by the prior art.

Figure 10:
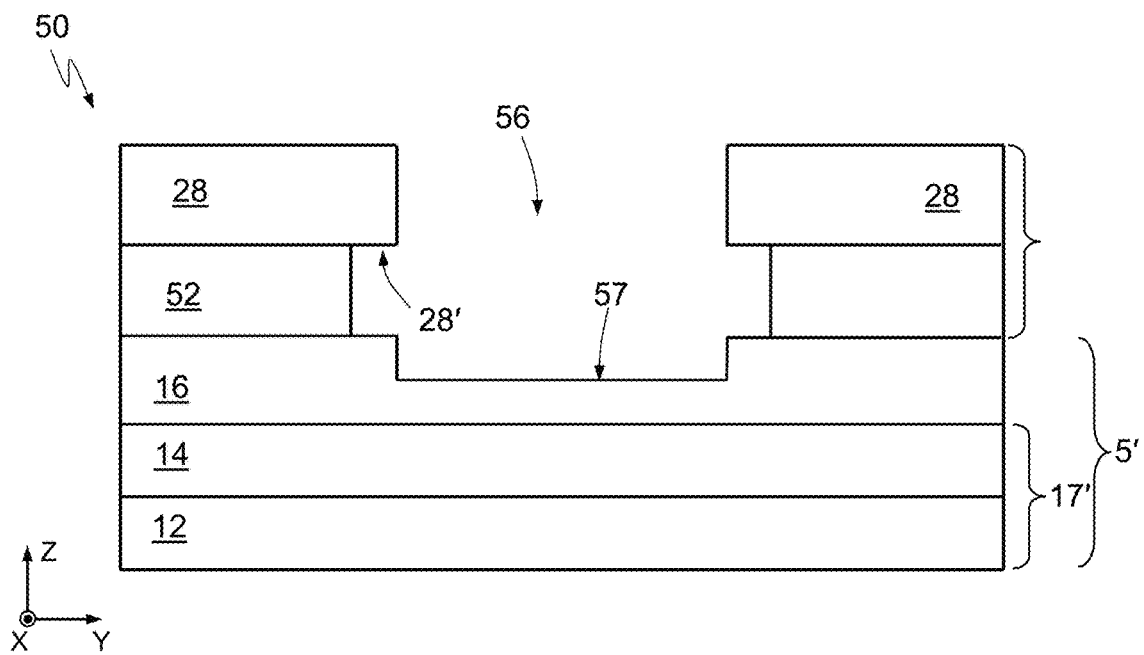

With reference to FIG. 10, an etch is then carried out (represented by arrows 40) for selective removal of a portion of the barrier layer 16, which is exposed through the trench 54. As with the method of FIGS. 2-6, the barrier layer 16 may be etched partially or completely through. The etch is preferably a dry etch such that the portions of the semiconductor body 5' covered by the overhanging portion 28' of the photoresist layer 28 are protected from etching The etching of the semiconductor body 5' at the trench 54 forms a contact trench 56, which extends in depth in the barrier layer 16, terminating inside the barrier layer 16 itself. The contact trench 56 is delimited underneath by a surface 57 of the barrier layer 16.

It is moreover evident that, in other embodiments, the contact trench 56 may extend throughout the entire thickness of the barrier layer 16, terminating at the interface with the underlying layer (here, the channel layer 14), or else proceeding into the underlying layer.

Figure 11:
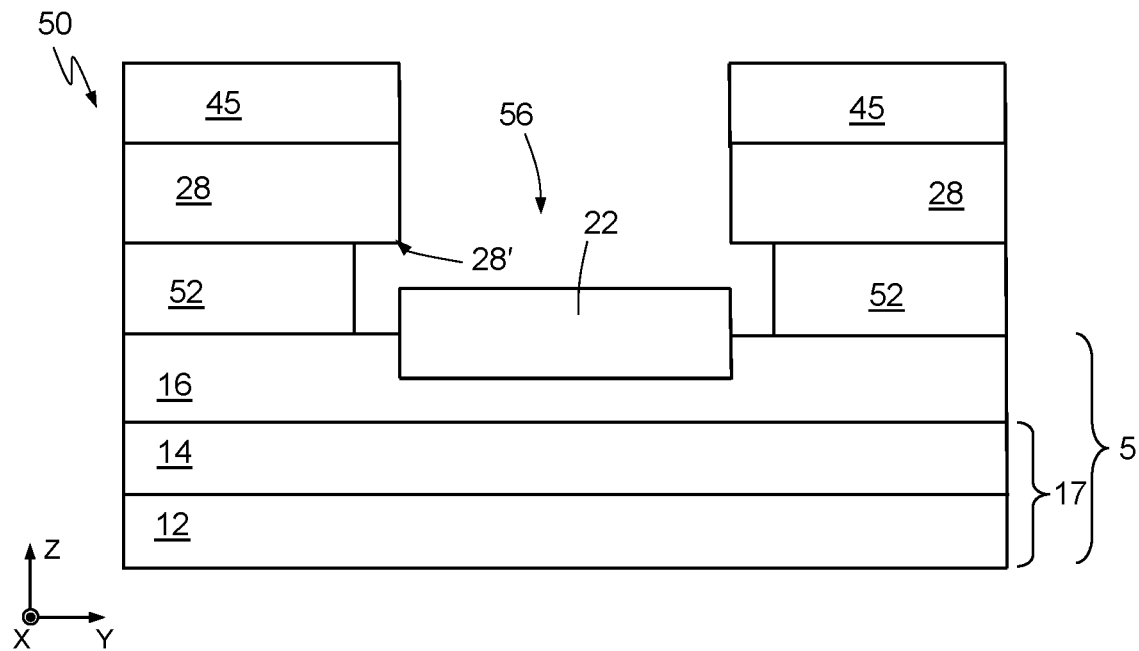

With reference to FIG. 11, there then follows deposition of one or more layers of conductive material, in particular one or more metal layers, via known techniques, such as sputtering or evaporation. In particular, the deposition forms the ohmic contact 22, which may include the layers 22a, 22b as discussed above.

The one or more conductive materials for formation of the ohmic contact 22 are both deposited inside the trench 56 and on the outside thereof, over the photoresist layer 28, which is thus covered at the top by the spurious metal deposition 45. Due to the presence of the overhanging portion 28' of the photoresist layer 28, which acts as a mask, the ohmic contact 22 is formed on the surface 57 of the barrier layer 16 and is spaced apart from the sidewalls of the underlayer 52. Further, due to the presence of the underlayer 52 and the vertical orientation of the sidewalls of the photoresist layer 28, no spurious metal material is formed on those sidewalls, in contrast to the spurious metal material 45' shown in FIG. 7.

Figure 12:
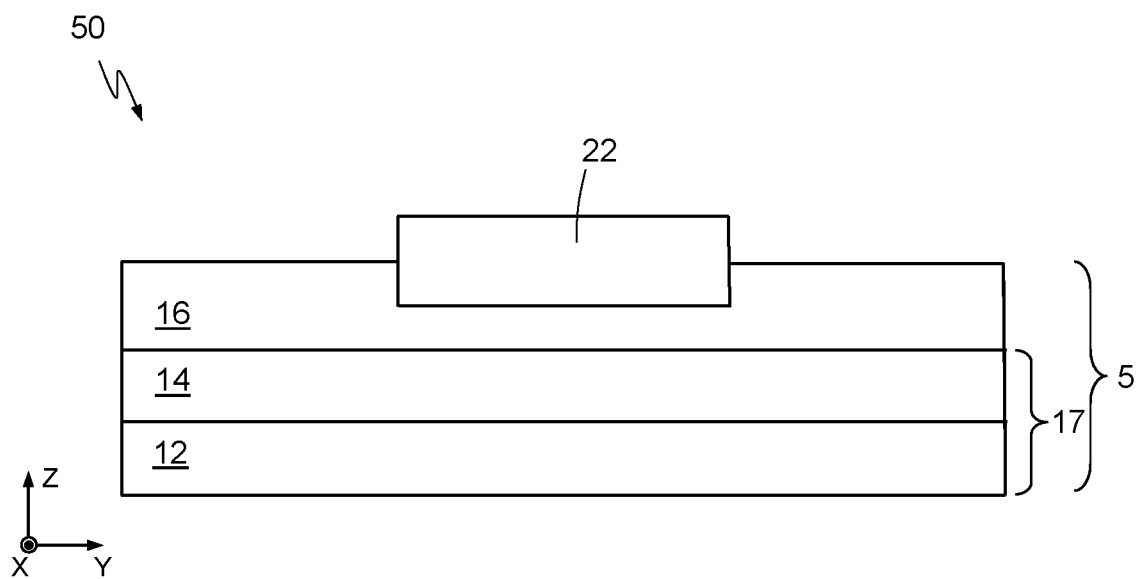

The formation of the ohmic contact 22 is followed by a lift-off step, for removing both the underlayer 52, the photoresist layer 28 and the spurious metal material 45. FIG. 12 shows the structure 20 at the end of the manufacturing steps described, which includes the recessed gold-free ohmic contact 22.

As may be seen, the ohmic contact 22 is automatically aligned, or self-aligned, to the recessed region formed previously in the heterostructure 17.

This result is achieved by using the same photoresist layer 28 in two different steps of the manufacturing process. Firstly, the photoresist layer 28 is used during etching 40 as a mask for creation of the contact trench 56 (and hence for defining the recessed region in the heterostructure 17). Moreover, the photoresist layer 28 is used as a further mask for forming the ohmic contact 22, by deposition of metal material.

From an examination of the characteristics of the disclosure provided according to the present disclosure the advantages that it affords are evident.

In particular it is possible to obtain gold-free ohmic contacts that present lower contact and access resistances, and the electrical performance of which is highly reproducible.

The manufacturing process is simplified via the use of the photoresist layer as mask both during the etching step and during metal deposition of the ohmic contact. The ohmic contact is thus automatically aligned with the recessed AlGaN region. This enables better electrical performance to be achieved by the HEMT device and reduction of the related production costs, as well as guaranteeing structural quality of the ohmic contact.

Having a low contact resistance enables a higher maximum current through the HEMT device, and hence a higher output power, to be obtained.

A low contact resistance is moreover fundamental in radiofrequency applications for improving the frequency response of the HEMT device.

According to the present disclosure, a passivation layer is not necessary for formation of the metal contact. The absence of passivating material in the process for manufacturing the ohmic contact enables a lower spread of the values of contact resistance to be obtained, thus improving the electrical properties of the HEMT device.

The disclosure described herein hence reduces the costs for manufacturing the ohmic contacts, rendering the manufacturing process compatible with CMOS technology.

Finally, it is clear that modifications and variations may be made to the disclosure described and illustrated herein, without thereby departing from the scope of protection thereof.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing an ohmic contact for a high electron mobility transistor (HEMT) device, comprising:
    forming a heterostructure that includes a substrate, a first gallium nitride layer on the substrate, and a barrier layer on the first gallium nitride layer;
    forming a second gallium nitride layer on the barrier layer of the heterostructure, the barrier layer being between the first gallium nitride layer and the second gallium nitride layer, the barrier layer having a first surface vertically separated from a second surface, the second surface being in contact with the first gallium nitride layer;
    forming a photoresist layer on the second gallium nitride layer;
    forming an opening through the photoresist layer and through the second gallium nitride layer, the opening extending into the barrier layer, the forming the opening including:
        forming vertical sidewalls of the second gallium nitride layer by forming the opening;
        forming inclined sidewalls of the photoresist layer, the inclined sidewalls inclined from vertical inward toward a center of the opening; and
        forming a recessed region in the barrier layer using the photoresist layer as an etching mask, the opening terminating inside the barrier layer between the first and second surface of the barrier layer;
    forming a stack of metal layers in the recessed region in the barrier layer, the stack of metal layers includes an interface layer having a first thickness and a filling layer having a second thickness that is greater than the first thickness, the filling layer being directly on the interface layer, at least a portion of the interface layer and the filling layer being vertically between the first and second surfaces of the barrier layer, including:
        forming sidewalls of the stack of metal layers vertically and forming the sidewalls of the stack of metal layers spaced from the sidewalls of the second gallium nitride layer and spaced from the inclined sidewalls of the photoresist layer; and
    removing the second gallium nitride layer and removing the photoresist layer.

2. The method according to claim 1, wherein forming the stack of metal layers comprises using the photoresist layer as an etching mask.

3. The method according to claim 1, wherein the interface layer is tantalum and is in contact with the heterostructure, and the filling layer is aluminum.

4. The method according to claim 1, wherein the interface layer is titanium and the filling layer is aluminum.

5. The method according to claim 1, further comprising rapid thermal annealing (RTA) of the stack of metal layers.

6. The method according to claim 5, wherein the RTA is at a temperature ranging between 450° C. and 650° C.

7. The method according to claim 1, wherein forming the opening includes forming overhang portions of the photoresist layer using the inclined sidewalls, the overhang portions extending inwardly into the opening beyond the sidewalls of the second gallium nitride layer.

8. The method according to claim 1, wherein the removing the second gallium nitride layer and the removing the photoresist layer is after forming the stack of metal layers.

9. A method, comprising:
    forming a semiconductor heterostructure that includes a gallium nitride channel layer having a thickness in a range of 1 and 5 microns and a barrier layer of aluminum gallium nitride having a thickness in the range of 5 and 30 nanometers directly on the gallium nitride channel layer;
    forming a gallium nitride protection layer having a thickness in the range of 1 and 4 nanometers directly on the barrier layer of the semiconductor heterostructure, the barrier layer being between the gallium nitride channel layer and the gallium nitride protection layer;

forming a photoresist layer on the gallium nitride protection layer;
forming an opening including:
  forming inclined sidewalls in the photoresist layer;
  forming vertical sidewalls of the gallium nitride protection layer;
  forming a trench by selectively removing portions of the barrier layer using the photoresist layer as a mask, including partly removing the barrier layer, the opening terminating inside the barrier layer between a first surface of the barrier layer and a second surface of the barrier layer, the first surface directly contacting the gallium nitride channel layer;
forming a stack of metal layers on the barrier layer in the trench, wherein the stack of metal layers includes a metal interface layer having a first thickness and an aluminum filling layer on the metal interface layer, the aluminum filling layer having a second thickness that is greater than the first thickness, sidewalls of the stack of metal layers being vertical, the entire interface layer being between the first and second surface of the barrier layer, a portion of the aluminum filling layer being between the first and second surface of the barrier layer, the stack of metal layers is not contacting the inclined sidewalls of the photoresist layer and is not contacting the sidewalls of the gallium nitride protection layer; and
removing the gallium nitride protection layer and the photoresist layer.

10. The method according to claim 9, wherein forming the stack of metal layers includes using the photoresist layer as an etching mask.

11. The method according to claim 9, wherein the metal interface layer is tantalum, and the filling layer is aluminum.

12. The method according to claim 9, wherein forming the opening includes forming overhang portions of the photoresist layer with the inclined sidewalls, the overhang portions extending internally into the opening beyond the sidewalls of the gallium nitride protection layer.

13. The method according to claim 9, wherein removing the gallium nitride protection layer and removing the photoresist layer are removed after forming the stack of metal layers.

14. A method, comprising:
forming a heterostructure of a high electron mobility transistor device, including:
  forming a first gallium nitride layer; and
  forming a second gallium nitride layer on the first gallium nitride layer;
  forming a third gallium nitride layer on the second gallium nitride layer, the second gallium nitride layer being between and in direct contact with the first gallium nitride layer and the third gallium nitride layer;
forming a photoresist layer on the third gallium nitride layer;
etching an opening through the photoresist layer that exposes the third gallium nitride layer and forms inclined sidewalls of the photoresist layer, the inclined sidewalls inclined from vertical toward a center of the opening;
forming vertical sidewalls of the third gallium nitride layer by etching, through the opening, a trench through the third gallium nitride layer;
etching, through the opening, and terminating the etching of the trench inside the second gallium nitride layer between a first surface and a second surface of the second gallium nitride layer;
forming an ohmic contact in the trench including forming a stack of metal layers with vertical sidewalls that are completely spaced from the layer of photoresist and completely spaced from the sidewalls of the third gallium nitride layer, wherein the stack of metal layers includes a metal interface layer with a first depth and a metal filling layer with a second depth greater than the first depth, the metal filling layer being directly on the metal interface layer, the metal filling layer being a different material than the metal interface layer, the metal interface layer being entirely between the first and second surface of the second gallium nitride layer, and at least a portion of the metal filling layer is between the first surface and the second surface of the second gallium nitride layer; and
removing the photoresist layer after depositing the stack of metal layers.

15. The method of claim 14, further comprising removing the third gallium nitride layer when the photoresist layer is removed.

16. The method of claim 15, wherein the third gallium nitride layer is in a range of 1 and 4 nanometers.

17. The method of claim 14, wherein after the photoresist layer is removed, the ohmic contact protrudes above a top surface of the second gallium nitride layer.

18. The method of claim 14, wherein the etching the opening through the photoresist layer includes forming inclined sidewalls of the photoresist layer.

* * * * *